United States Patent
Ji et al.

(10) Patent No.: US 11,948,643 B2
(45) Date of Patent: Apr. 2, 2024

(54) NONVOLATILE MEMORY DEVICE, OPERATING METHOD THEREOF, AND MEMORY SYSTEM INCLUDING THE SAME

(71) Applicant: SK hynix Inc., Icheon (KR)

(72) Inventors: Seunggu Ji, Icheon (KR); Yong Il Jung, Icheon (KR)

(73) Assignee: SK hynix Inc., Icheon (KR)

( * ) Notice: Subject to any disclaimer, the term of this patent is extended or adjusted under 35 U.S.C. 154(b) by 237 days.

(21) Appl. No.: 17/069,714

(22) Filed: Oct. 13, 2020

(65) Prior Publication Data

US 2021/0343345 A1   Nov. 4, 2021

(30) Foreign Application Priority Data

Apr. 29, 2020   (KR) .................. 10-2020-0052368

(51) Int. Cl.
| | |
|---|---|
| G11C 16/08 | (2006.01) |
| G11C 11/56 | (2006.01) |
| G11C 16/04 | (2006.01) |
| G11C 16/10 | (2006.01) |
| G11C 16/34 | (2006.01) |

(52) U.S. Cl.
CPC .......... *G11C 16/10* (2013.01); *G11C 11/5628* (2013.01); *G11C 11/5671* (2013.01); *G11C 16/0483* (2013.01); *G11C 16/3459* (2013.01)

(58) Field of Classification Search
CPC ...................................................... G11C 16/08
See application file for complete search history.

(56) References Cited

U.S. PATENT DOCUMENTS

2019/0156894 A1 *   5/2019   Park ...................... G11C 16/08

FOREIGN PATENT DOCUMENTS

KR           1020130117422 A       10/2013

* cited by examiner

*Primary Examiner* — Jason Lappas

(57) ABSTRACT

A nonvolatile memory device includes a memory cell array and a control unit. The memory cell array includes a plurality of memory regions coupled to a plurality of word lines. The plurality of memory regions include first and second memory regions coupled to upper and lower word lines, respectively. The control logic performs, after receiving first data and second data, a first program operation on the first memory region to store the first data and a second program operation on the second memory region to store the second data.

11 Claims, 16 Drawing Sheets

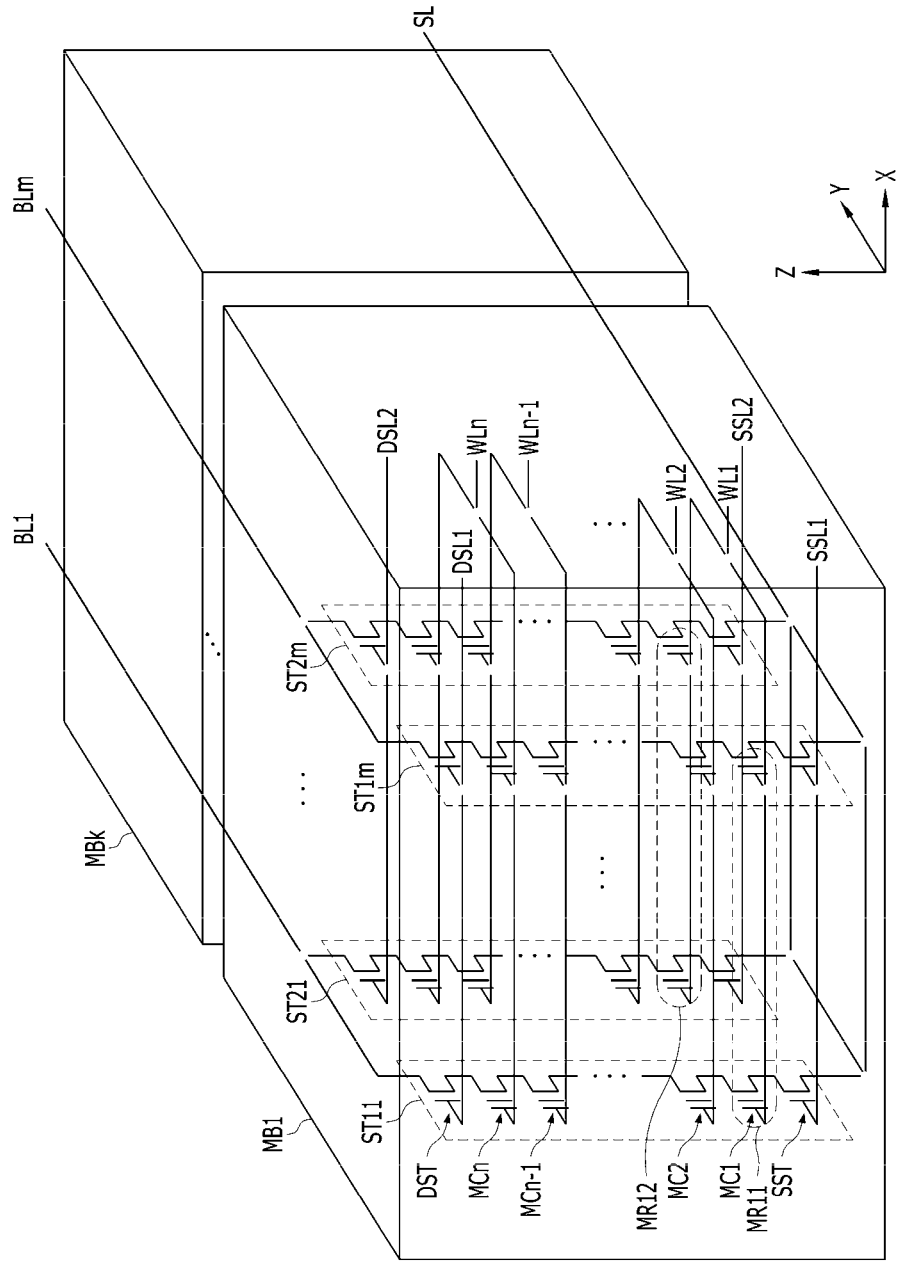

FIG. 4A

|     | PR1 | PR2 |
|-----|-----|-----|
| WL1 | 1   | 3   |
| WL2 | 2   | 5   |
| WL3 | 4   |     |
| ⋮   |     |     |

FIG. 4B

|  | MR1 | | MR2 | | MR3 | | MR4 | | MR5 | | MR6 | | MR7 | | MR8 | |
|---|---|---|---|---|---|---|---|---|---|---|---|---|---|---|---|---|
|  | PR1 | PR2 | PR1 | PR2 | PR1 | PR2 | PR1 | PR2 | PR1 | PR2 | PR1 | PR2 | PR1 | PR2 | PR1 | PR2 |
| WL1 | 1 | 10 | 2 | 12 | 3 | 14 | 4 | 16 | 5 | 18 | 6 | 20 | 7 | 22 | 8 | 24 |
| WL2 | 9 | 26 | 11 | 28 | 13 | 30 | 15 | 32 | 17 | 34 | 19 | 36 | 21 | 38 | 23 | 40 |
| WL3 | 25 |  | 27 |  | 29 |  | 31 |  | 33 |  | 35 |  | 37 |  | 39 |  |
| ... |  |  |  |  |  |  |  |  |  |  |  |  |  |  |  |  |

FIG. 6B

|     | MR1 | | MR2 | | MR3 | | MR4 | | MR5 | | MR6 | | MR7 | | MR8 | |
| --- | --- | --- | --- | --- | --- | --- | --- | --- | --- | --- | --- | --- | --- | --- | --- | --- |
|     | PR1 | PR2 | PR1 | PR2 | PR1 | PR2 | PR1 | PR2 | PR1 | PR2 | PR1 | PR2 | PR1 | PR2 | PR1 | PR2 |
| WL1 | 1 | 10 | 2 | 12 | 3 | 14 | 4 | 16 | 5 | 18 | 6 | 20 | 7 | 22 | 8 | 24 |
| WL2 | 9 | 26 | 11 | 28 | 13 | 30 | 15 | 32 | 17 | 34 | 19 | 36 | 21 | 38 | 23 | 40 |
| WL3 | 25 | | 27 | | 29 | | 31 | | 33 | | 35 | | 37 | | 39 | |
| ... | | | | | | | | | | | | | | | | |

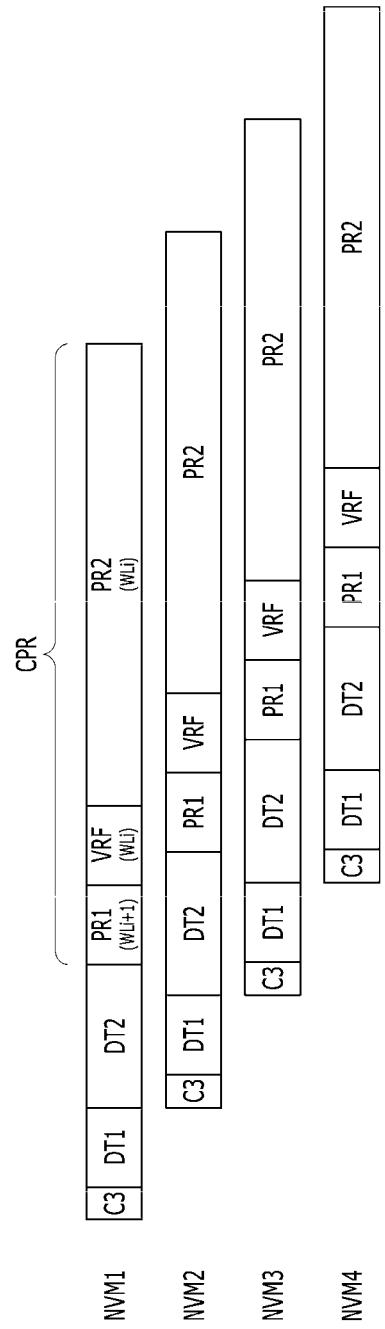

NONVOLATILE MEMORY DEVICE, OPERATING METHOD THEREOF, AND MEMORY SYSTEM INCLUDING THE SAME

CROSS-REFERENCES TO RELATED APPLICATION

The present application claims priority under 35 U.S.C. § 119(a) to Korean application number 10-2020-0052368, filed on Apr. 29, 2020, in the Korean Intellectual Property Office, which is incorporated herein by reference in its entirety as set forth in full.

BACKGROUND

1. Technical Field

Various embodiments are related to a memory system, and more particularly, to a memory system including a nonvolatile memory device.

2. Related Art

A memory system may be configured to store data provided by a host device in response to a write request from the host device. Furthermore, the memory system may be configured to provide stored data to the host device in response to a read request from the host device. The host device is an electronic device capable of processing data and may include a computer, a digital camera, or a mobile phone. The memory system may be mounted in the host device, or may be detachably coupled to the host device.

SUMMARY

Embodiments of the present disclosure provide a nonvolatile memory device having improved performance of sequential write, an operating method thereof and memory system including the same.

In an embodiment, a nonvolatile memory device may include a memory cell array and a control unit. The memory cell array may include a plurality of memory regions coupled to a plurality of word lines. The plurality of memory regions may include first and second memory regions coupled to upper and lower word lines, respectively. The control unit may perform, after receiving first data and second data, a first program operation on the first memory region to store the first data and a second program operation on the second memory region to store the second data.

In an embodiment, a memory system may include a nonvolatile memory device and a controller. The nonvolatile memory device may include a plurality of memory regions coupled to a plurality of word lines. The plurality of memory regions may include first and second memory regions coupled to first and second word lines, respectively. The controller may provide first data and second data to the nonvolatile memory device at a time to store the first data in the first memory region and the second data in the second memory region.

In an embodiment, an operating method of a nonvolatile memory device may include receiving first data and second data at a time; performing a first program operation on a first memory region to store the first data, the first memory region coupled to an upper word line; and performing a second program operation on a second memory region to store the second data, the second memory region coupled to a lower word line.

BRIEF DESCRIPTION OF THE DRAWINGS

FIGS. 2A and 2B are diagrams illustrating detailed configurations of a memory block.

FIGS. 4A and 4B are tables each illustrating a program order for a plurality of word lines according to an embodiment.

FIGS. 6A and 6B are tables each illustrating a program order for a plurality of word lines according to an embodiment.

FIG. 7 is a timing diagram of a program operation of nonvolatile memory devices according to an embodiment.

DETAILED DESCRIPTION

Embodiments of the present disclosure will be described below in more detail with reference to the accompanying drawings. Embodiments of the present disclosure may, however, be embodied in different forms and should not be construed as limited to the embodiments set forth herein. Rather, these embodiments are provided so that this disclosure will be thorough and complete, and will fully convey the scope of embodiments of the present disclosure to those skilled in the art.

The drawings are not necessarily to scale and, in some instances, proportions may have been exaggerated in order to clearly illustrate features of the embodiments. The terminology used herein is for the purpose of describing particular embodiments only and is not intended to be limiting of the invention.

As used herein, the term "and/or" includes at least one of the associated listed items. It will be understood that when an element is referred to as being "connected to", or "coupled to" another element, it may be directly on, connected to, or coupled to the other element, or one or more intervening elements may be present. As used herein, singular forms are intended to include the plural forms and vice versa, unless the context clearly indicates otherwise. It will be further understood that the terms "comprises," "comprising," "includes," and "including" when used in this specification, specify the presence of the stated elements and do not preclude the presence or addition of one or more other elements.

Hereinafter, embodiments of the present disclosure will be described below with reference to the accompanying drawings.

Figure 1:
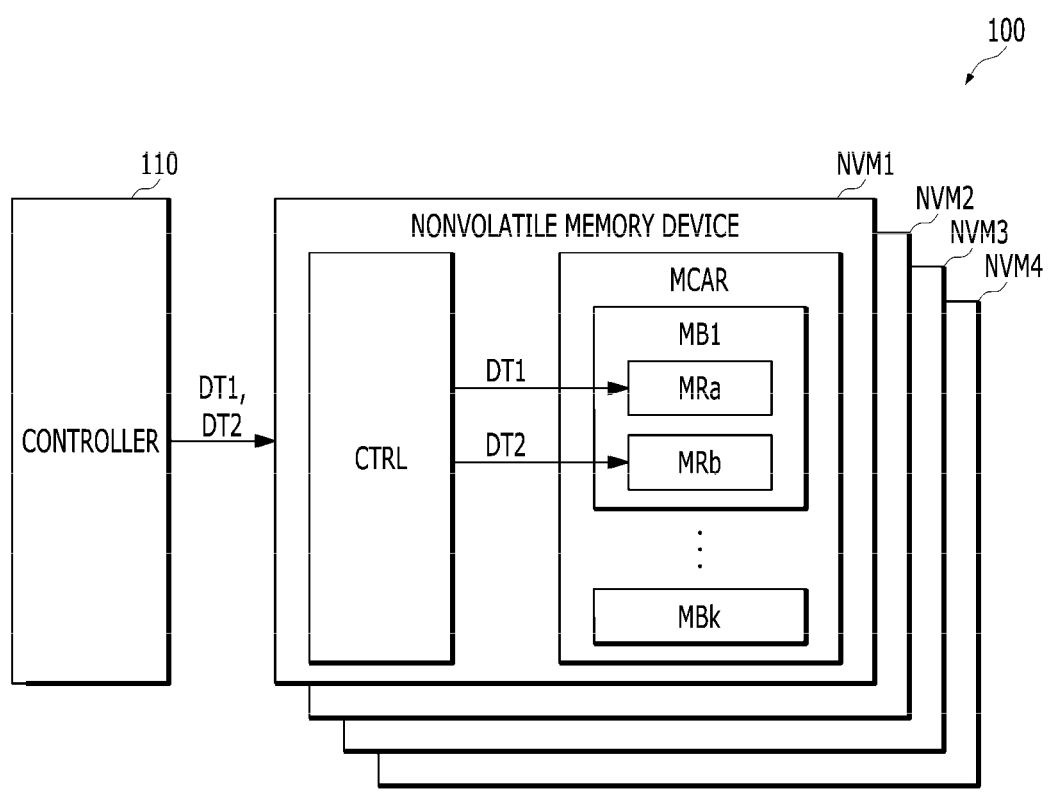
FIG. 1 is a block diagram illustrating a memory system according to an embodiment.

FIG. 1 is a block diagram illustrating a memory system 100 according to an embodiment.

The memory system 100 may be configured to store data provided by an external host device (not shown) in response to a write request from the host device. Furthermore, the memory system 100 may be configured to provide stored data to the host device in response to a read request from the host device.

The memory system 100 may be configured as a personal computer memory card international association (PCMCIA) card, a compact flash (CF) card, a smart media card, a memory stick, various multimedia cards (e.g., MMC, eMMC, RS-MMC, and MMC-micro), secure digital (SD) cards (e.g., SD, Mini-SD and Micro-SD), a universal flash storage (UFS) or a solid state drive (SSD).

The memory system 100 may include a controller (e.g., a memory controller) 110 and nonvolatile memory devices NVM1 to NVM4. The memory controller 110 may be implemented as hardware controllers as well as firmware and software controllers. For example, the memory controller 110 may be implemented as a controller (e.g., a controller 1210 in FIG. 9) to provide an interface between the memory system 100 and a host (e.g., a host device 1100 in FIG. 9) through any one of protocols, such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The controller 110 may control an overall operation of the memory system 100. The controller 110 may control the nonvolatile memory devices NVM1 to NVM4 in order to perform a foreground operation in response to an instruction from the host device. The foreground operation may include operations of writing data in the nonvolatile memory devices NVM1 to NVM4 and reading data from the nonvolatile memory devices NVM1 to NVM4 in response to instructions from the host device, that is, a write request and a read request.

Furthermore, the controller 110 may control the nonvolatile memory devices NVM1 to NVM4 in order to perform a background operation independently of the host device. The background operation may be performed to improve the performance of the memory system 100 and extend lifetime of the memory system 100. The background operation may include one or more of a wear-leveling operation, a garbage collection operation, an erase operation, a read reclaim operation, and a refresh operation for the nonvolatile memory devices NVM1 to NVM4. Like the foreground operation, the background operation may include operations of writing data in the nonvolatile memory devices NVM1 to NVM4 and reading data from the nonvolatile memory devices NVM1 to NVM4.

The controller 110 may control a consolidated program operation of the nonvolatile memory device NVM1. As will be described later, the consolidated program operation of the nonvolatile memory device NVM1 may be an operation of receiving at a time first data DT1 and second data DT2, which are to be stored respectively into memory regions MRa and MRb, from the controller 110 and consecutively programming the first data DT1 and the second data DT2 respectively into the memory regions MRa and MRb. The memory regions MRa and MRb on which the consolidated program operation is to be performed may be coupled to adjacent word lines. The controller 110 may control the nonvolatile memory devices NVM1 to NVM4 to perform the consolidated program operation in a parallel way. Therefore, according to an embodiment, interference between the memory regions MRa and MRb may be minimized and the performance of sequential write may be improved because of the consolidated program operation.

For the consolidated program operation of the nonvolatile memory device NVM1, the controller 110 may provide the first data DT1 and the second data DT2 to the nonvolatile memory device NVM1 at a time. To provide the first data DT1 and the second data DT2 at a time may indicate providing the first data DT1 and the second data DT2 through a consolidated program command, rather than providing the first data DT1 and the second data DT2 through respective program commands. To provide the first data DT1 and the second data DT2 at a time may indicate providing the first data DT1 and the second data DT2 together before any of the first data DT1 and the second data DT2 is programmed, rather than providing one of the first data DT1 and the second data DT2 and then providing the other one of the first data DT1 and the second data DT2 after the program of the one has been completed.

The consolidated program command may include addresses indicating the memory regions MRa and MRb.

In an embodiment, the controller 110 may control the nonvolatile memory device NVM1 to perform a first program operation and a second program operation respectively through a first program command and a second program command, which are separate from each other. The controller 110 may control the nonvolatile memory device NVM1 to perform one of the first program operation and the second program operation in response to the first program command or the second program command, rather than performing both the first program operation and the second program operation.

The memory region MRa may be coupled to a first word line (e.g., an upper word line) and the memory region MRb may be coupled to a second word line (e.g., a lower word line), which is adjacent to the upper word line. The first data DT1 may include least significant bits to be stored into the memory region MRa. The second data DT2 may include more significant bits than least significant bits, which have been stored in the memory region MRb.

According to the control of the controller 110, the nonvolatile memory devices NVM1 to NVM4 may store data provided from the controller 110 and may read stored data to provide the read data to the controller 110.

The nonvolatile memory devices NVM1 to NVM4 may share an input/output line configured to receive a command and data provided from the controller 110. That is, the nonvolatile memory devices NVM1 to NVM4 may be coupled to the same input/output line. Therefore, the controller 110 may start, after completion of data transmission to any one among the nonvolatile memory devices NVM1 to NVM4, data transmission to another one among the nonvolatile memory devices NVM1 to NVM4.

The nonvolatile memory device NVM1 may include a memory cell array MCAR and a control unit CTRL. The control unit (or a control logic) CTRL may control an overall operation of the nonvolatile memory device NVM1. In an embodiment, the control logic CTRL may be implemented as a control circuit to control an operation of the nonvolatile memory device NVM1. For example, the control logic CTRL may control one or more components (e.g., a row decoder 320, a column decoder 340, a data read/write block 330, and a voltage generator 350 in FIG. 13) of the nonvolatile memory device NMV1 to perform a read operation, a program operation, and an erase operation on a selected region of the memory cell array MCAR.

The memory cell array MCAR may include memory blocks MB1 to MBk. A memory block may be a unit on which the nonvolatile memory device NVM1 performs an erase operation, but embodiments of the present disclosure are not limited thereto. For example, the memory block may be a different memory unit than the unit on which an erase operation is performed.

The memory block MB1 may include the memory regions MRa and MRb. As described above, the memory regions MRa and MRb may be coupled respectively to the adjacent upper and lower word lines. Between any two word lines coupled to the memory block MB1, one word line closer to the source line may be referred to as the lower word line and the other word line may be referred to as the upper word line.

The memory region MRa may be configured by a plurality of memory cells coupled to the upper word line and the memory region MRb may be configured by a plurality of memory cells coupled to the lower word line.

The control unit CTRL may receive the first data DT1 and the second data DT2 at a time from the controller 110 and may perform the consolidated program operation on the memory regions MRa and MRb. The consolidated program operation may include the first program operation for the first data DT1 and the second program operation for the second data DT2.

The control unit CTRL may perform, after the reception of all the first data DT1 and the second data DT2 has been completed, the first program operation of storing the first data DT1 into the memory region MRa as least significant bits. The control unit CTRL may perform the second program operation of storing the second data DT2 into the memory region MRb as more significant bits than least significant bits, the least significant bits having been stored in the memory region MRb.

Before performing the second program operation, the control unit CTRL may further perform a verify operation of identifying data that have been stored in the memory region MRb.

Each of the nonvolatile memory devices NVM2 to NVM4 may be configured and operate in substantially the same way as the nonvolatile memory device NVM1.

Each of the nonvolatile memory devices NVM1 to NVM4 may include a flash memory apparatus such as a NAND flash or a NOR flash, a ferroelectric random access memory (FeRAM), a phase-change random access memory (PCRAM), a magnetic random access memory (MRAM), or a resistive random access memory (ReRAM).

Each of the nonvolatile memory devices NVM1 to NVM4 may include one or more planes, one or more memory chips, one or more memory dies, or one or more memory packages.

Although FIG. 1 illustrates the memory system 100 including four nonvolatile memory devices NVM1 to NVM4, the number of nonvolatile memory devices included in the memory system 100 are not limited thereto.

The memory system 100 may further include another group of nonvolatile memory devices sharing an input/output line, similarly to the group of the nonvolatile memory devices NVM1 to NVM4. The controller 110 may control such an additional group of nonvolatile memory devices to perform the consolidated program operation in a parallel way, similarly to the way of controlling the group of the nonvolatile memory devices NVM1 to NVM4.

Figure 2A:
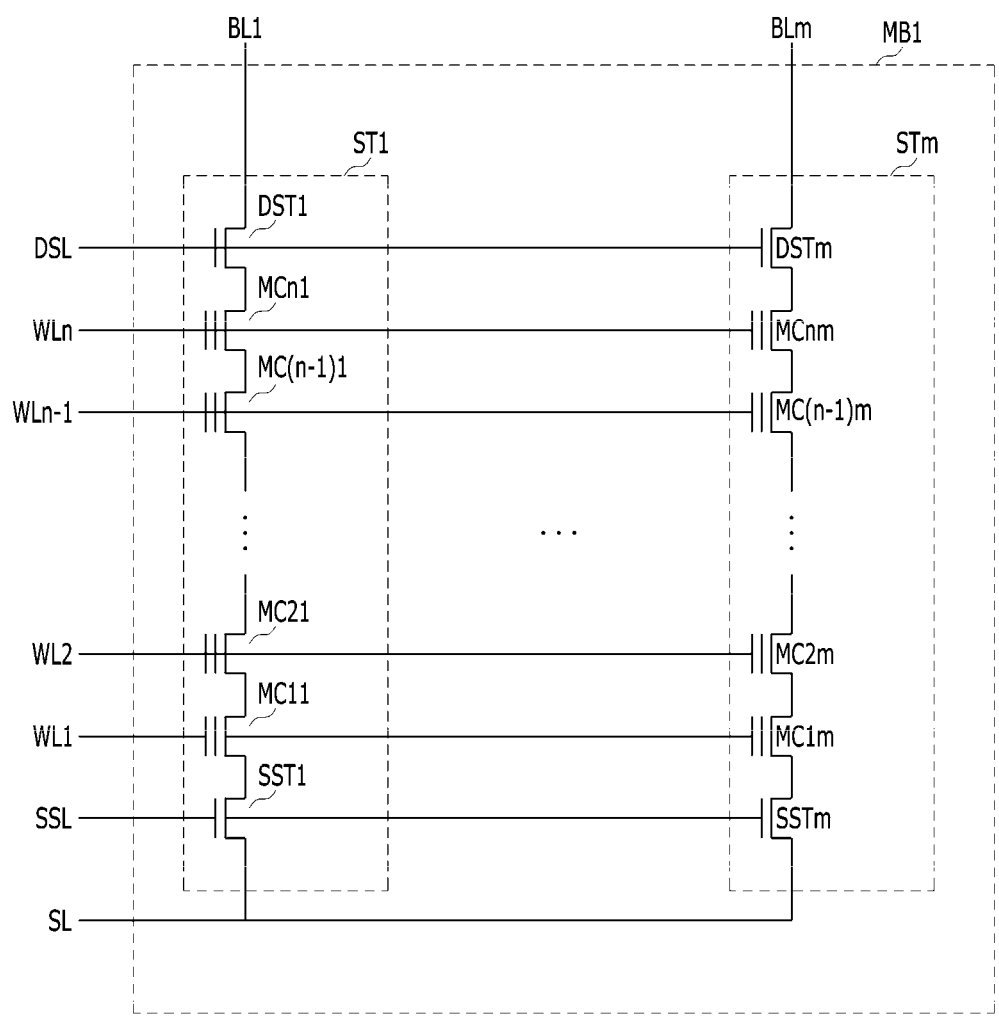

FIGS. 2A and 2B are diagrams illustrating detailed configurations of the memory block MB1. Each of the memory blocks MB1 to MBk illustrated in FIG. 1 may be configured in substantially the same way as the configuration illustrated in FIGS. 2A and 2B.

Referring to FIG. 2A, the memory block MB1 may be coupled to a plurality of word lines WL1 to WLn arranged in parallel between a source select line SSL and a drain select line DSL. The memory block MB1 may include a plurality of strings ST1 to STm. Bit lines BL1 to BLm may be coupled respectively to the strings ST1 to STm. A source line SL may be coupled commonly to the strings ST1 to STm. The strings ST1 to STm may be configured in substantially the same way as each other and thus the string ST1 coupled to the bit line BL1 will be described as an example.

The string ST1 may include a source select transistor SST1, a plurality of memory cells MC11 to MCn1, and a drain select transistor DST1, which are serially coupled to each other between the source line SL and the bit line BL1.

The source select transistor SST1 may be coupled to the source line SL at its source. The drain select transistor DST1 may be coupled to the bit line BL1 at its drain. The memory cells MC11 to MCn1 may be serially coupled to each other between the source select transistor SST1 and the drain select transistor DST1. Source select transistors SST to SSTm included respectively in the strings ST1 to STm may be coupled to the source select line SSL at their gates. Drain select transistors DST1 to DSTm may be coupled to the drain select line DSL at their gates. Memory cells MC11 to MC1m and MCn1 to MCnm may be coupled respectively to the word lines WL1 to WLn at their gates. Memory cells coupled to the same word line among the memory cells MC11 to MC1m and MCn1 to MCnm may be simultaneously programmed during a program operation. Memory cells coupled to the same word line may be included in the same memory region. The word lines WL1 to WLn may correspond respectively to different memory regions.

One or more bits may be stored in each of the memory cells MC11 to MC1m and MCn1 to MCnm.

Between any two adjacent word lines (e.g., word lines WL1 and WL2) among the word lines WL1 to WLn, the lower word line may be the word line WL1 closer to the source line SL and the upper word line may be the word line WL2 farther to the source line SL.

Referring to FIG. 2B, the memory block MB1 may include strings ST11 to ST1m and ST21 to ST2m. Each of the strings ST11 to ST1m and ST21 to ST2m may extend in a vertical direction (i.e., in a Z direction). In the memory block MB1, 'm' number of strings may be arranged in a row direction (i.e., in an X direction). Although FIG. 2B illustrates two strings arranged in a column direction (i.e., in a Y direction), three or more strings may be arranged in the column direction (the Y direction).

The strings ST11 to ST1m and ST21 to ST2m may be configured in the same way as each other. For example, the string ST11 may include a source select transistor SST, memory cells MC1 to MCn, and a drain select transistor DST, which are serially coupled to each other between the source line SL and the bit line BL1. The source select transistor SST may be coupled to the source line SL at its source. The drain select transistor DST may be coupled to the bit line BL1 at its drain. The memory cells MC11 to MCn1 may be serially coupled to each other between the source select transistor SST and the drain select transistor DST.

Source select transistors included respectively in the strings arranged in the same row (i.e., the strings arranged in the X direction) may be coupled to the same source select line at their gates. For example, the source select transistors of the strings ST11 to ST1m arranged in a first row may be coupled to a first source select line SSL1 at their gates. The source select transistors of the strings ST21 to ST2m arranged in a second row may be coupled to a second source select line SSL2 at their gates. In an embodiment, the source select transistors of the strings ST11 to ST1m and ST21 to ST2m may be coupled in common to a single source select line.

Drain select transistors included respectively in the strings arranged in the same row may be coupled to the same drain select line at their gates. For example, the drain select transistors of the strings ST11 to ST1m arranged in a first row may be coupled to a first drain select line DSL1 at their gates. The drain select transistors of the strings ST21 to ST2m arranged in a second row may be coupled to a second drain select line DSL2 at their gates.

Strings arranged in the same column (i.e., strings arranged in the Y direction) may be coupled to the same bit line. For example, strings ST11 and ST21 arranged in a first column may be coupled to a bit line BL1. Strings ST1m and ST2m arranged in a m-th column may be coupled to a bit line BLm.

Memory cell arranged at the same level in the vertical direction (i.e., in the same XY plane) may be coupled to the same word line at their gates. For example, memory cells arranged at the same location as the memory cell MC1 in the vertical direction within the strings ST11 to ST1m and ST21 to ST2m may be coupled to the word line WL1. Memory cells arranged at the same location as the memory cell MC2 in the vertical direction within the strings ST11 to ST1m and ST21 to ST2m may be coupled to the word line WL2.

Memory cells arranged in the same row and coupled to the same word line may configure a single memory region to be simultaneously programmed during a program operation. For example, memory cells arranged in a first row and coupled to the word line WL1 may configure a memory region MR11. Memory cells arranged in a second row and coupled to the word line WL1 may configure a memory region MR12.

Although the memory regions MR11 and MR12 shown in FIG. 2B are in the same XY plane, the memory regions MR11 and MR12 may be arranged respectively in different XZ planes. That is, each word line may be coupled to a plurality of memory regions arranged in different XZ planes, a number of which is a number of rows.

Between any two adjacent word lines (e.g., the word lines WL1 and WL2) among the word lines WL1 to WLn, a word line (e.g., the word line WL1) that is closer to the source line SL than another word line (e.g., the word line WL2) may be referred to as a lower word line, whereas the another word line may be referred to as an upper word line.

Figure 3:
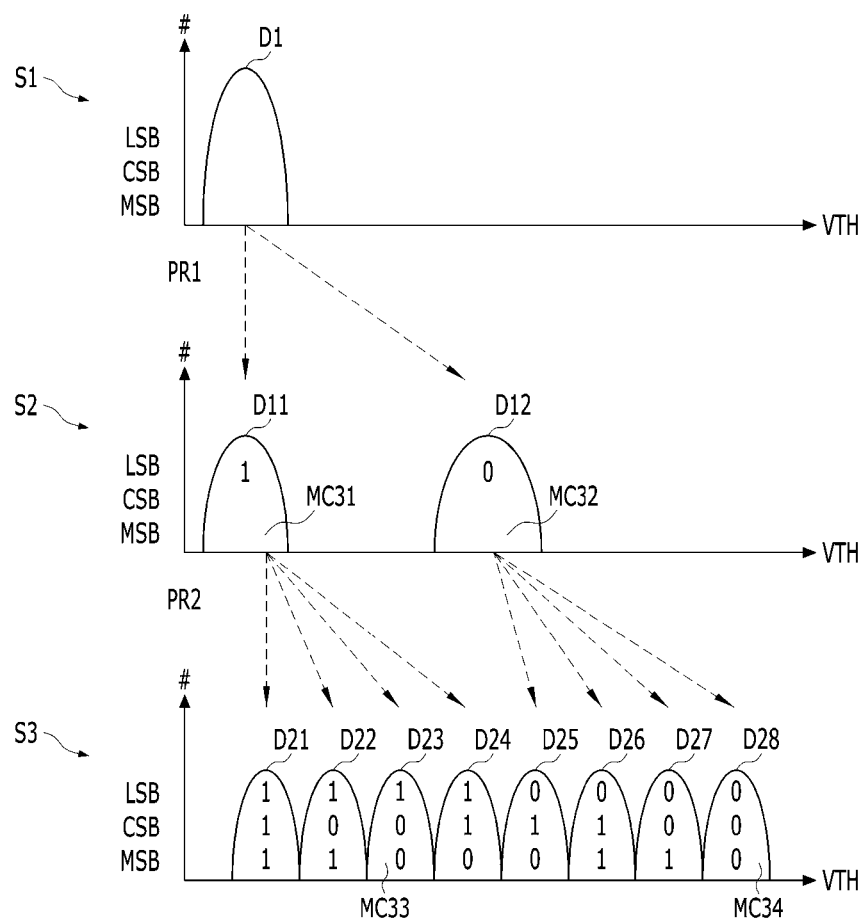
FIG. 3 is a diagram illustrating a program method according to an embodiment.

FIG. 3 is a diagram illustrating a program method according to an embodiment. FIG. 3 illustrates threshold voltage distributions of memory cells belonging respectively to states S1 to S3. The horizontal axis "VTH" may represent a threshold voltage of a memory cell. The vertical axis "#" may represent a number of memory cells for a threshold voltage.

Referring to FIG. 3, in an initial erase state S1, memory cells may belong to the threshold voltage distribution D1. The memory cells belonging to the threshold voltage distribution D1 may be ones to be simultaneously programmed. The memory cells belonging to the threshold voltage distribution D1 may be one coupled to a common word line. The memory cells belonging to the threshold voltage distribution D1 may configure a memory region.

When a first program operation PR1 is performed on the memory cells in the memory region, the state may change from the erase state S1 to the state S2. The first program operation PR1 may be an operation of programming least significant bit (LSB) data into memory cells. The first program operation PR1 may be performed through the consolidated program command or through a solitary first program command.

In the state S2, the memory cells may belong to the threshold voltage distributions D11 and D12. The memory cells belonging to the threshold voltage distribution D11 may store LSB data of "1". The memory cells belonging to the threshold voltage distribution D12 may store LSB data of "0". For example, the threshold voltage of the memory cell MC32 may rise such that the memory cell MC32 belongs to the threshold voltage distribution D12 and thus the memory cell MC32 may be determined to store the LSB data of "0". The threshold voltage of the memory cell MC31 may stay such that the memory cell MC31 belongs to the threshold voltage distribution D11 and thus the memory cell MC31 may be determined to store the LSB data of "1".

When a second program operation PR2 is performed on the memory cells, the state may change from the state S2 to the state S3. The second program operation PR2 may be an operation of programming central significant bit (CSB) data and most significant bit (MSB) data into memory cells. The second program operation PR2 may be performed through the consolidated program command or through a solitary second program command.

In the state S3, the memory cells may belong to the threshold voltage distributions D21 to D28. The memory cells belonging to the threshold voltage distributions D21 to D28 may store, as MSB, CSB and LSB data, "111", "101", "001", "011", "010", "110", "100", and "000", respectively. The threshold voltage distributions D21 to D24 may be subdivided from the threshold voltage distribution D11. The threshold voltage distributions D25 to D28 may be subdivided from the threshold voltage distribution D12. For example, the threshold voltage of the memory cell MC34 may rise such that the memory cell MC34 belongs to the threshold voltage distribution D28 and thus the memory cell MC34 may be determined to store the data of "000". For example, the threshold voltage of the memory cell MC33 may rise such that the memory cell MC33 belongs to the threshold voltage distribution D23 and thus the memory cell MC33 may be determined to store the data of "001".

Both the memory cells MC33 and MC34 may store the data of "00" as the MSB data and the CSB data and may belong to different threshold voltage distributions D23 and D28 according to whether the memory cells MC33 and MC34 store the data of "1" or "0" as the LSB data. Therefore, before programming the MSB data and the CSB data into a memory cell (i.e., before the second program operation PR2 is performed on the memory cell), a verify operation of checking whether the data of "1" or "0" as the LSB data is stored in the memory cell may be performed.

As illustrated in FIG. 3, the first program operation PR1 and the second program operation PR2 may be performed to store 3-bit data into each memory cell. In an embodiment, in order to finally store k-bit data into each memory cell, the first program operation PR1 may be performed as described above to store the least significant bit (LSB) data and the second program operation PR2 may be performed to store remaining more significant bits (i.e., more significant bits than the LSB) data into each memory cell. The second program operation PR2 may be performed for dividing the two threshold voltage distributions D11 and D12 into '2^k' number of threshold voltage distributions in total.

Figure 4A:
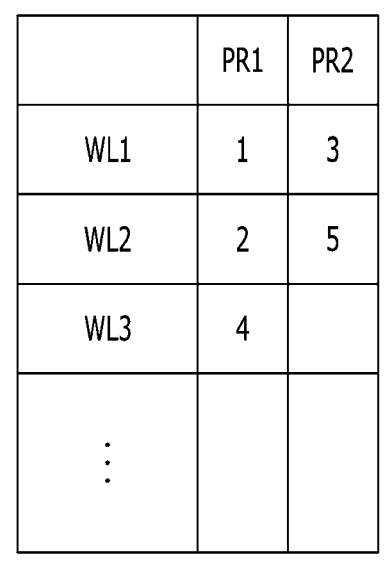

FIGS. 4A and 4B are tables each illustrating a program order for a plurality of word lines according to an embodiment.

Referring to FIG. 4A, the first program operation PR1 and the second program operation PR2 may be performed according to a predetermined program order in consideration of an interference effect that may occur between adjacent word lines while programming data. Numbers illustrated within the table of FIG. 4A may represent the program order.

For example, firstly the first program operation PR1 may be performed on one or more memory cells coupled to the word line WL1. Secondly, the first program operation PR1 may be performed on one or more memory cells coupled to the word line WL2. Thirdly, the second program operation PR2 may be performed on one or more memory cells coupled to the word line WL1. Fourthly, the first program operation PR1 may be performed on one or more memory cells coupled to the word line WL3. Fifthly, the second program operation PR2 may be performed on one or more memory cells coupled to the word line WL2. As such, before the second program operation PR2 is applied to the lower word line (e.g., an i-th word line), the first program operation PR1 may be applied to the upper word line (e.g., an (i+1)-th word line).

Referring to FIG. 4B, when 8 number of memory regions MR1 to MR8 are coupled to each word line, the first program operation PR1 and the second program operation PR2 may be performed according to a predetermined program order for minimizing the interference effect. The first memory regions MR1 coupled respectively to word lines may be memory regions arranged in the same plane, for example, a first common XZ plane of FIG. 2B. Likewise, the second memory regions MR2 coupled respectively to word lines may be memory regions arranged in a second common XZ plane. The first common XZ plane and the second common XZ plane may be arranged in the Y-direction of FIG. 2B and disposed adjacent to each other. So may be the third memory region MR3 to the eighth memory region MR8.

Although eight memory regions MR1 to MR8 are coupled to each word line in the embodiment shown in FIG. 4B, the program operation may be performed in a similar way on different numbers of memory regions depending on an embodiment.

First to eighthly, the first program operation PR1 may be sequentially performed on the first memory region MR1 to the eighth memory region MR8 corresponding to the word line WL1. For example, the first program operation PR1 may be sequentially performed on the first memory region MR1 to the eighth memory region MR8 that are coupled to the word line WL1.

Ninthly, the first program operation PR1 may be performed on the first memory region MR1 corresponding to the word line WL2. Tenthly, the second program operation PR2 may be performed on the first memory region MR1 corresponding to the word line WL1. Such operation for the word line WL2 and the word line WL1 may be repeated in the same way for the second memory region MR2 to the eighth memory region MR8.

Twenty-fifthly, the first program operation PR1 may be performed on the first memory region MR1 corresponding to the word line WL3. Twenty-sixthly, the second program operation PR2 may be performed on the first memory region MR1 corresponding to the word line WL2. Such operation for the word line WL3 and the word line WL2 may be repeated in the same way for the second memory region MR2 to the eighth memory region MR8.

When the memory regions MR1 to MR8 of different planes are coupled to each word line, the first program operation PR1 may be first performed for the upper word line before performing the second program operation PR2 for the lower word line, in each plane. For example, a first one of the first memory regions MR1 may be coupled to the word line WL1 and a second one of the first memory regions MR1 may be coupled to the word line WL2, the word line WL1 being closer to a source line than the word line WL2. In this case, the first program operation PR1 may be performed on memory cells in the second one of the first memory regions MR1 coupled to the word line WL2 before performing the second program operation PR2 on memory cells in the first one of the first memory regions MR1 coupled to the word line WL1.

Figure 5:
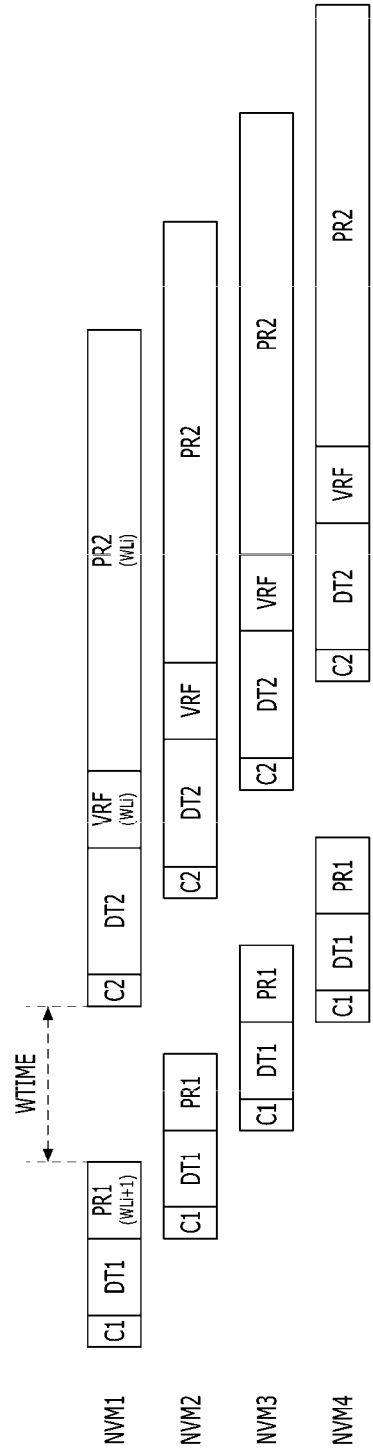
FIG. 5 is a timing diagram of a program operation on nonvolatile memory devices according to an embodiment.

FIG. 5 is a timing diagram of performing the first program operation PR1 and the second program operation PR2 on nonvolatile memory devices NVM1 to NVM4 according to an embodiment.

Referring to FIG. 5, the controller 110 may control, for storing sequential data, the nonvolatile memory devices NVM1 to NVM4 to perform the first program operation PR1 and the second program operation PR2 in a parallel way. The controller 110 may apply the program order described with reference to FIG. 4A or 4B to each of the nonvolatile memory devices NVM1 to NVM4. However, the controller 110 may control each of the first program operation PR1 and the second program operation PR2 through a solitary first program command C1 and a solitary second program command C2. In other words, the controller 110 may control the first program operation PR1 and the second program operation PR2 using the first program command C1 and the second program command C2, respectively, which are two separate program commands.

The controller 110 may sequentially provide the first program command C1 and the first data DT1 to the nonvolatile memory devices NVM1 to NVM4. The first data DT1 may be LSB data to be stored in a memory region coupled to an upper word line (WLi+1). In response to the first program command C1, each of the nonvolatile memory devices NVM1 to NVM4 may perform the first program operation PR1 for the upper word line (WLi+1) to store the first data DT1.

After the first data DT1 is completely provided to the nonvolatile memory devices NVM1 to NVM4, the controller 110 may sequentially provide the second program command C2 and the second data DT2 to the nonvolatile memory devices NVM1 to NVM4. The second data DT2 may be remaining data (e.g., CSB data and MSB data) to be stored in a memory region coupled to a lower word line WLi. In response to the second program command C2, each of the nonvolatile memory devices NVM1 to NVM4 may perform the verify operation VRF of identifying the first data (e.g., LSB data) already stored in the memory region coupled to the lower word line WLi. Then, each of the nonvolatile memory devices NVM1 to NVM4 may perform the second program operation PR2 for the lower word line WLi to store the second data DT2.

Through such program scheme, the controller 110 may promptly store the sequential data while minimizing the interference effect. However, since each of the nonvolatile memory devices NVM1 to NVM4 performs the first program operation PR1 and the second program operation PR2 separately, each of the nonvolatile memory devices NVM1 to NVM4 may wait by an amount of waiting time WTIME between the end of the first program operation PR1 and start of the reception of the second program command C2.

Figure 6A:
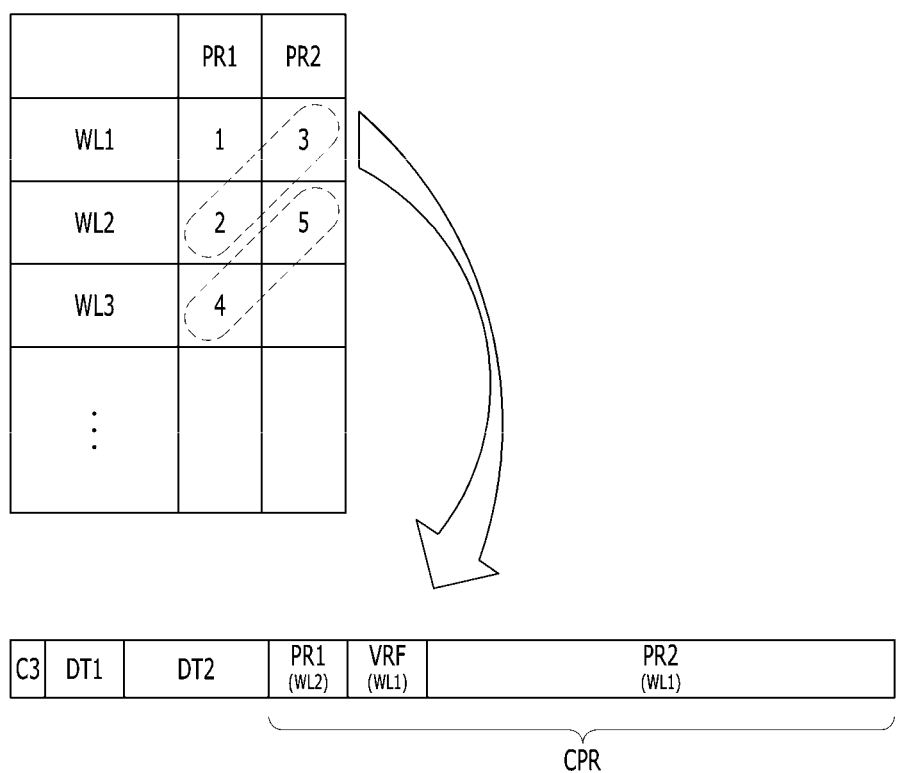

FIGS. 6A and 6B are tables each illustrating a program order for a plurality of word lines according to an embodiment.

Referring to FIG. 6A, the nonvolatile memory devices NVM1 to NVM4 may perform the consolidated program operation for further performance improvement of sequential write. For example, first, the first program operation PR1 may be performed for the word line WL1. Then, a first consolidated program operation may be performed, the first consolidated program operation including the first program operation PR1 for the word line WL2 and the second program operation PR2 for the word line WL1. Then a second consolidated program operation may be performed, the second consolidated program operation including the first program operation PR1 for the word line WL3 and the second program operation PR2 for the word line WL2. Here, the program order described with reference to FIG. 4A may be kept in consideration of the interference effect.

For example, the consolidated program operation CPR for the word line WL2 and the word line WL1 will be described in more detail. The controller 110 may provide at a time the consolidated program command C3 together with the first data DT1 and the second data DT2 to a nonvolatile memory device. The first data DT1 may be LSB data to be stored in a memory region coupled to the word line WL2. The second data DT2 may be remaining data (e.g., CSB data and MSB data) to be stored in a memory region coupled to the word line WL1.

The control unit CTRL of the nonvolatile memory device may perform the consolidated program operation CPR in response to the consolidated program command C3. The control unit CTRL may perform the first program operation PR1 for the word line WL2 in order to store the first data DT1, may perform the verify operation VRF for the word line WL1, and may perform the second program operation PR2 for the word line WL1 in order to store the second data DT2.

Referring to FIG. 6B, each word line may be coupled to eight memory regions MR1 to MR8. In the embodiment shown in FIG. 6B, a plurality of consolidated program operations may be performed according to the program order described with reference to FIG. 4B. For example, a first consolidated program operation may be performed by performing the first program operation PR1 on a second one of the first memory regions MR1 coupled to the word line WL2, performing the verify operation VRF on a first one of the first memory regions MR1 coupled to the word line WL1, and performing the second program operation PR2 on the first one of the first memory regions MR1. A second consolidated program operation may be performed by performing the first program operation PR1 (or a third program operation to store the first data DT1) on a second one of the second memory regions MR2 coupled to the word line WL2, performing the verify operation (or a second verify operation) VRF on a first one of the second memory regions MR2 coupled to the word line WL1, and performing the second program operation PR2 (or a fourth program operation to store the second data DT2) on the first one of the second memory regions MR2.

FIG. 7 is a timing diagram of the consolidated program operation CPR of the nonvolatile memory devices NVM1 to NVM4 according to an embodiment.

Referring to FIG. 7, in order to store sequential data, the controller 110 may control the nonvolatile memory devices NVM1 to NVM4 to perform the consolidated program operation CPR in a parallel way. Each of the nonvolatile memory devices NVM1 to NVM4 may perform the first program operation PR1 and the second program operation PR2 according to the program order described with reference to FIG. 6A or 6B.

The controller 110 may sequentially provide the consolidated program command C3, the first data DT1, and the second data DT2 to the nonvolatile memory devices NVM1 to NVM4. The first data DT1 may be LSB data to be stored in a memory region coupled to an upper word line (WLi+1). The second data DT2 may be remaining data (e.g., CSB data and MSB data) to be stored in a memory region coupled to a lower word line WLi.

In response to the consolidated program command C3, each of the nonvolatile memory devices NVM1 to NVM4 may sequentially perform the first program operation PR1 for the upper word line (WLi+1), may perform the verify operation VRF for the lower word line WLi, and may perform the second program operation PR2 for the lower word line WLi.

Consequently, as illustrated in FIG. 7, the waiting time WTIME (refer to FIG. 5) may be removed and thus the performance of sequential write may be further improved while minimizing the interference between memory regions. For example, a memory system according to the embodiment shown in FIG. 7 uses a single consolidated program command C3 to perform the first program operation PR1 for a first word line, the verify operation VRF for a second word line, and the second program operation PR2 for the second word line that is closer to a source line than the first word line, rather than using two separate commands C1 and C2 for performing the first program operation PR1 and the verify/second program operations VRF/PR2, respectively. When the memory system according to the embodiment of FIG. 7 performs a sequential write operation on the nonvolatile memory devices NMV1 to NMV4, a given time interval (e.g., the waiting time WTIME in FIG. 5) between the end of performing the first program operation PR1 and the start of performing the verify/second program operations VRF/PR2 for each of the nonvolatile memory devices NVM1 to NVM4 may be removed. As a result, the duration of the total time interval to perform the sequential write operation on the nonvolatile memory devices NVM1 to NVM4 can be reduced compared to that of a memory system according the embodiment of FIG. 5. In addition, the efficiency of performing a sequential write operation on a plurality of nonvolatile memory devices by the memory system according to the embodiment of FIG. 7 may not be significantly reduced as the number of the nonvolatile memory devices increases, compared to that of the memory system according to the embodiment of FIG. 5.

Figure 8:
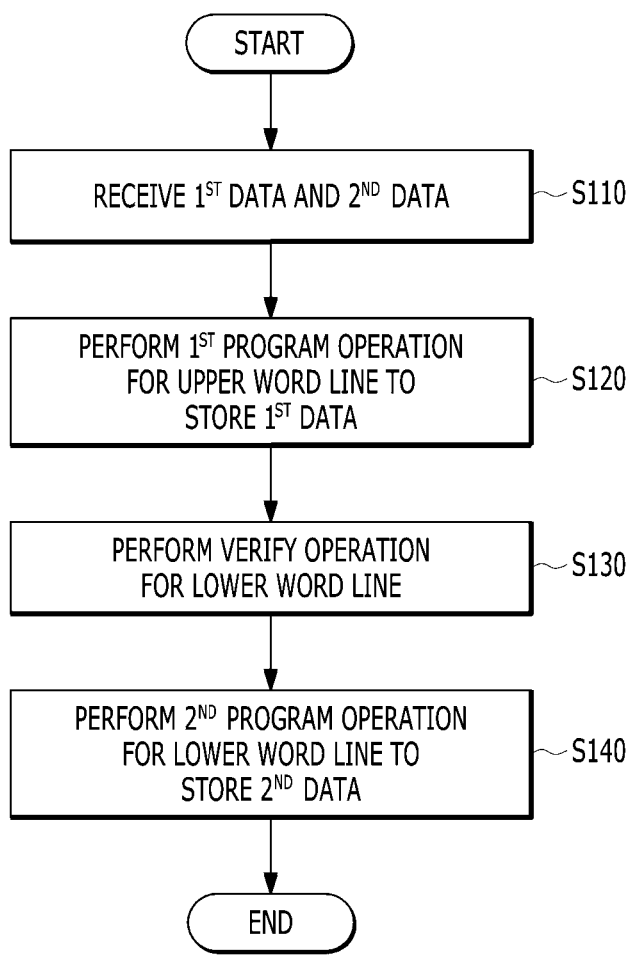
FIG. 8 is a flowchart illustrating an operating method of a nonvolatile memory device of FIG. 1 according to an embodiment.

FIG. 8 is a flowchart illustrating an operating method of a nonvolatile memory device (e.g., the nonvolatile memory device NVM1 in FIG. 1) according to an embodiment.

Referring to FIG. 8, in step S110, the nonvolatile memory device NVM1 may receive at a time the first data DT1 and the second data DT2 from the controller 110.

In step S120, the control unit CTRL may perform, after receiving the first data DT1 and the second data DT2, the first program operation on the memory region MRa coupled to the upper word line to store the first data DT1.

In step S130, the control unit CTRL may perform the verify operation on the memory region MRb coupled to the lower word line. The control unit CTRL may identify data already stored in the memory region MRb through the verify operation.

In step S140, the control unit CTRL may perform the second program operation on the memory region MRb coupled to the lower word line to store the second data DT2. By referring to data identified through the verify operation, the control unit CTRL may perform the second program operation of subdividing the threshold voltage distributions of the memory cells coupled to the lower word line. In an embodiment, the control unit CTRK may perform the first program operation on the memory region MRa, the verify operation on the memory region MRb, and the second program operation on the memory region MRb in response to a single consolidated program command, rather than two or more separated commands.

Figure 9:
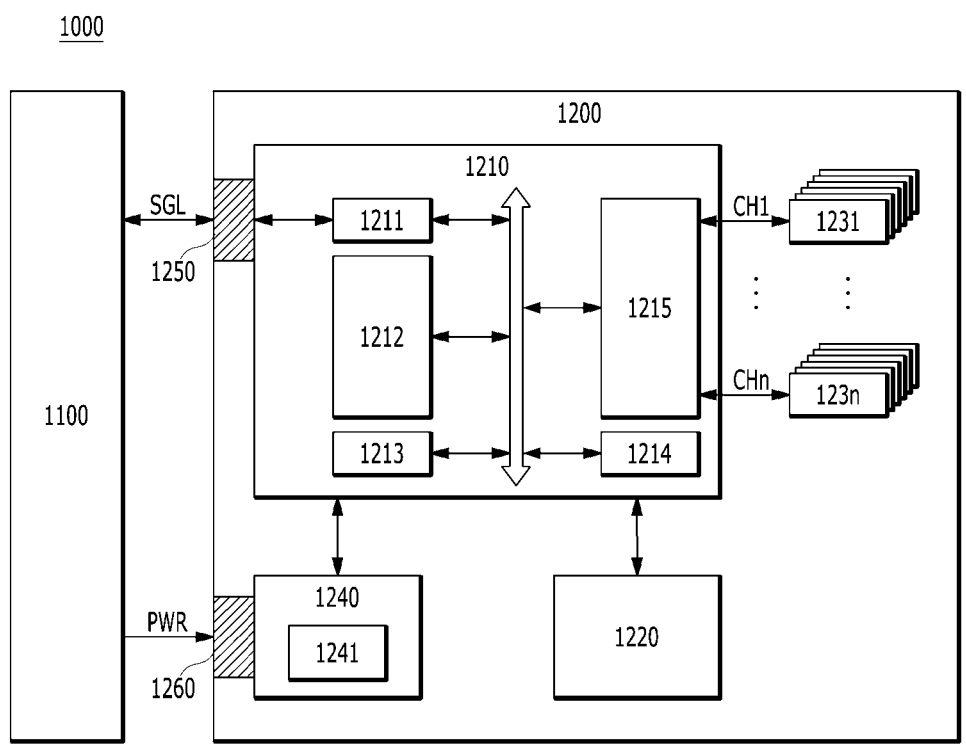
FIG. 9 is a diagram illustrating a data processing system including a solid state drive (SSD) in accordance with an embodiment.

FIG. 9 is a diagram illustrating a data processing system 1000 including a solid state drive (SSD) 1200 in accordance with an embodiment. Referring to FIG. 9, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may be configured in the same manner as the controller 110 shown in FIG. 1.

The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus. Each of the nonvolatile memory devices 1231 to 123n may be configured in the same manner as the nonvolatile memory device NVM1 shown in FIG. 1.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
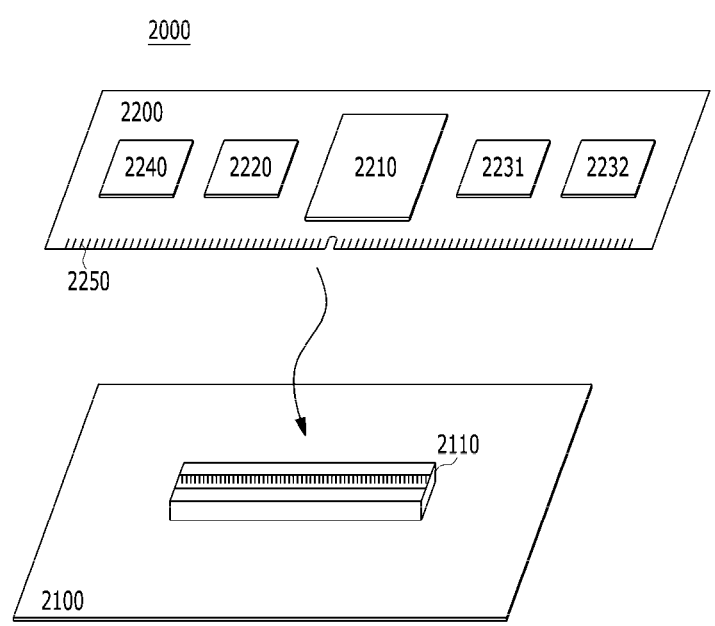
FIG. 10 is a diagram illustrating a data processing system including a memory system in accordance with an embodiment.

FIG. 10 is a diagram illustrating a data processing system 2000 including a memory system 2200 in accordance with an embodiment. Referring to FIG. 10, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 11:
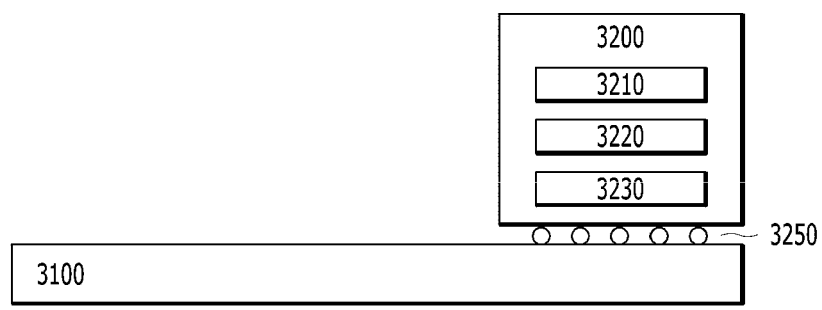
FIG. 11 is a diagram illustrating a data processing system including a memory system in accordance with an embodiment.

FIG. 11 is a diagram illustrating a data processing system 3000 including a memory system 3200 in accordance with an embodiment. Referring to FIG. 11, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 9.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
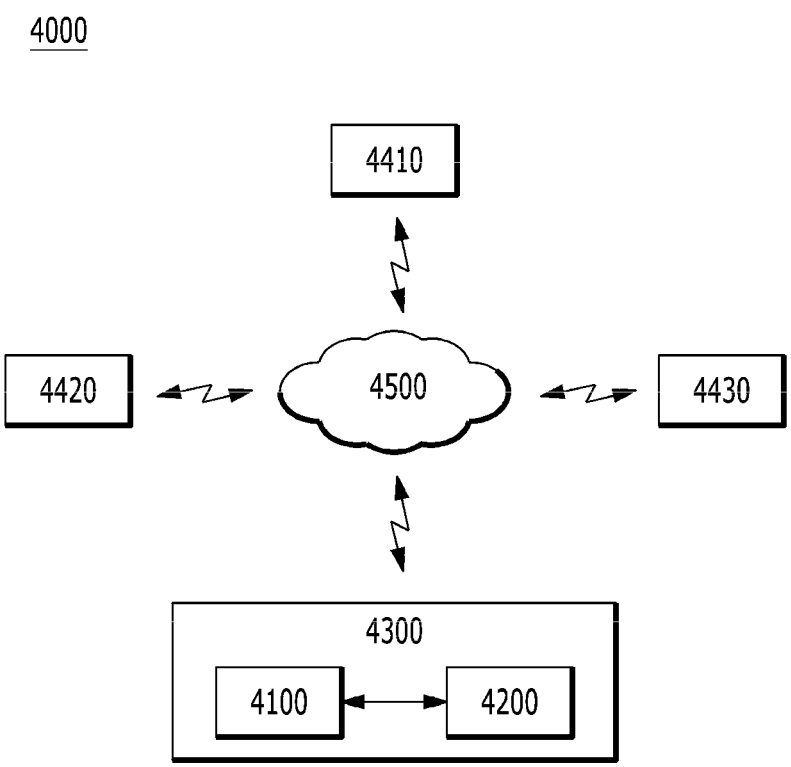
FIG. 12 is a diagram illustrating a network system including a memory system in accordance with an embodiment.

FIG. 12 is a diagram illustrating a network system 4000 including a memory system 4200 in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 1, the SSD 1200 shown in FIG. 9, the memory system 2200 shown in FIG. 10 or the memory system 3200 shown in FIG. 11.

Figure 13:
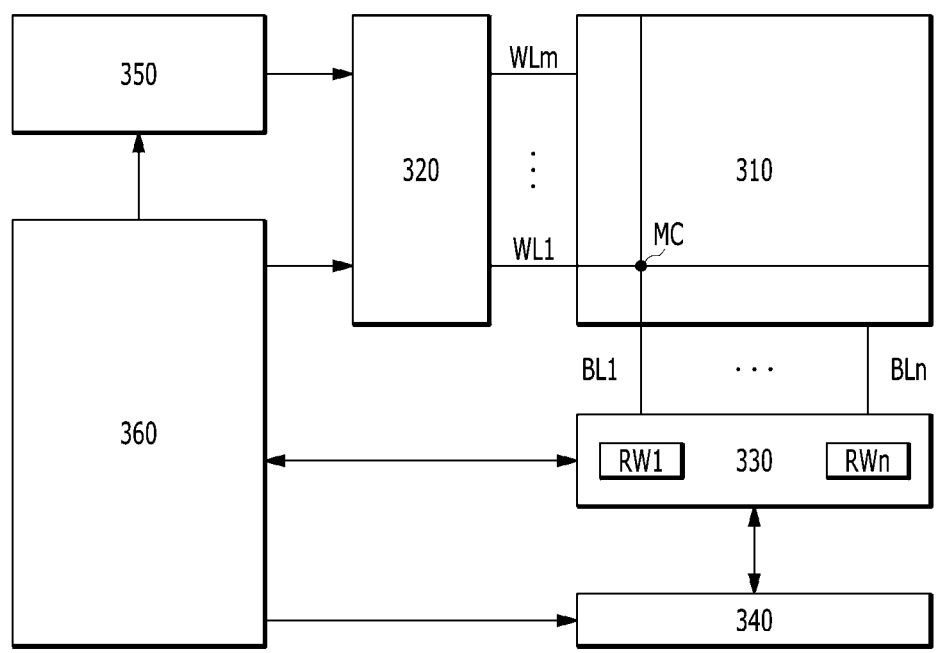
FIG. 13 is a block diagram illustrating a nonvolatile memory device included in a memory system in accordance with an embodiment.

FIG. 13 is a block diagram illustrating a nonvolatile memory device 300 included in a memory system in accordance with an embodiment. Referring to FIG. 13, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other. The memory cell array 310 may be configured in the same manner as the memory cell array MCAR shown in FIG. 1.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300. The control logic 360 may be configured in the same manner as the control unit CTRL shown in FIG. 1.

While certain embodiments have been described above, it will be understood to those skilled in the art that the embodiments described are by way of example only.

Accordingly, the nonvolatile memory device, the operating method thereof and the memory system including the same should not be limited based on the described embodiments. Rather, the nonvolatile memory device, the operating method thereof and the memory system including the same described herein should only be limited in light of the claims that follow when taken in conjunction with the above description and accompanying drawings.

What is claimed is:

1. A nonvolatile memory device comprising:
a memory block including a first memory region coupled to an upper word line and a second memory region coupled to a lower word line; and
a control logic performing, after receiving first data and second data has been completed, a first program operation on the first memory region to store the first data and a second program operation on the second memory region to store the second data.

2. The nonvolatile memory device of claim 1, wherein the control logic performs, before performing the second program operation, a verify operation of identifying data that have been stored in memory cells of the second memory region coupled to the lower word line.

3. The nonvolatile memory device of claim 1, wherein the control logic performs, after receiving the first data and the second data at a time, the first program operation and the second program operation in response to a single consolidated program command provided together with the first data and the second data.

4. The nonvolatile memory device of claim 1, wherein the control logic stores the first data as first least significant bits into first memory cells in the first memory region and stores the second data as more significant bits than second least significant bits into second memory cells, the second memory cells being in the second memory region that is coupled to the lower word line and having stored the second least significant bits.

5. The nonvolatile memory device of claim 1, wherein the lower word line and the upper word line are adjacent to each other, and the lower word line is closer to a source line than the upper word line.

6. The nonvolatile memory device of claim 3, wherein the control logic performs the first program operation, a verify operation for the lower line, and the second program operation in response to the single consolidated program command.

7. An operating method of a nonvolatile memory device, the operating method comprising:
receiving first data and second data at a time;
after receiving the first data and the second data has been completed, performing a first program operation on a first memory region to store the first data, the first memory region coupled to an upper word line; and
after performing the first program operation, performing a second program operation on a second memory region to store the second data, the second memory region coupled to a lower word line,
wherein the first memory region and the second memory region are included in a same memory block.

8. The operating method of claim 7, further comprising performing, before the performing of the second program operation, a verify operation of identifying data that have been stored in memory cells of the second memory region coupled to the lower word line.

9. The operating method of claim 7, further comprising receiving a single consolidated program command provided together with the first data and the second data to perform the first program operation and the second program operation.

10. The operating method of claim 7, wherein the first data is stored as first least significant bits in first memory cells of the first memory region coupled to the upper word line, and
wherein the second data is stored as more significant bits than second least significant bits in second memory cells, the second memory cells being in the second memory region that is coupled to the lower word line and having stored the second least significant bits.

11. The operating method of claim 7, wherein the lower word line and the upper word line are adjacent to each other.

* * * * *